(12) United States Patent
Martens et al.

(10) Patent No.: US 6,882,160 B2
(45) Date of Patent: Apr. 19, 2005

(54) METHODS AND COMPUTER PROGRAM PRODUCTS FOR FULL N-PORT VECTOR NETWORK ANALYZER CALIBRATIONS

(75) Inventors: Jon S. Martens, San Jose, CA (US); David V. Judge, Temple, NH (US); Jimmy A. Bigelow, Castroville, CA (US)

(73) Assignee: Anritsu Company, Morgan Hill, CA (US)

( * ) Notice: Subject to any disclaimer, the term of this patent is extended or adjusted under 35 U.S.C. 154(b) by 0 days.

(21) Appl. No.: 10/702,028

(22) Filed: Nov. 5, 2003

(65) Prior Publication Data

US 2004/0251922 A1 Dec. 16, 2004

Related U.S. Application Data

(60) Provisional application No. 60/477,919, filed on Jun. 12, 2003.

(51) Int. Cl.[7] .............................................. G01R 15/12
(52) U.S. Cl. ........................ 324/601; 324/73.1; 702/85; 702/106
(58) Field of Search ............................... 324/601, 73.1, 324/612, 637, 642, 650; 702/85, 106

(56) References Cited

U.S. PATENT DOCUMENTS 5,578,932 A * 11/1996 Adamian .................... 324/601
6,300,775 B1   10/2001 Peach et al. ................ 324/601

OTHER PUBLICATIONS

*Arbitrary Impedance*, Anritsu Application Note 11410–00284, May 2002, pp. 1–11.

Marks, R.B., and Williams, D.F., "Characteristic Impedance Determination Using Propagation Constant Measurement," IEEE Microwave and Guided Wave Letters, vol. 1, No. 6, Jun. 1991, pp. 141–143.

Tippet, J.C., "A Rigorous Technique for Measuring the Scattering Matrix of a Multiport Device with a 2–Port Network Analyzer," IEEE Transactions on Microwave Theory and Techniques, vol. MTT–30, No. 5, May 1982, pp. 661–666.

Williams, D.F., and Walker, D.K., "In–Line Multiport Calibration," 51st ARFTG Digest, Jun. 1998, pp. 88–90.

* cited by examiner

*Primary Examiner*—Vincent Q. Nguyen
(74) *Attorney, Agent, or Firm*—Fliesler Meyer LLP

(57) ABSTRACT

Techniques are provided for performing full N-port calibrations in an environment in which a test set is used to connect an N-port DUT to an M-port VNA, where N>M. Techniques for incorporating port impedances as part of a calibration sequence are provided. Also provided are techniques for using sequential characterization and de-embedding to generate virtual calibrations that are then used in a renormalization process.

23 Claims, 6 Drawing Sheets

METHODS AND COMPUTER PROGRAM PRODUCTS FOR FULL N-PORT VECTOR NETWORK ANALYZER CALIBRATIONS

PRIORITY CLAIM

This application claims priority to U.S. Provisional Application No. 60/477,919, entitled "Methods and Computer Program Produces for Full N-Port Vector Network Analyzer Calibrations", filed Jun. 12, 2003.

FIELD OF THE INVENTION

The present invention relates to vector network analyzers (VNAs), and more particularly to calibrations of VNAs.

BACKGROUND OF THE INVENTION

Multi-port devices are characterized by their number of ports, typically referred to throughout this application as N, where N is 2 or greater. S-parameter measurement instruments, such as a vector network analyzer (VNA), are used to characterize such a multi-port (i.e., N-port) device under test (DUT, often simply referred to as a "device") by measuring complex transmission and reflection characteristics of the DUT.

In the RF and microwave regions virtually all devices are characterized by their S (or scattering) matrices. The S matrix is composed of S-parameters. S-parameter measurement is the standard method for device characterization over a very wide range of frequencies, from less than 1 MHz to above 40 GHz. These parameters are used because they are easily determined, they provide directly relevant measures of device performance, and they are well defined for various types of devices. If other device representations are required, such as impedance or admittance parameters, then these can be readily deduced from the measured S-parameters.

More specifically, S-parameters of a multi-port device characterize how the device interacts with signals presented to the various ports of the device. An exemplary S-parameter is "S12"(often shown as "$S_{12}$"). The first number is the port that the signal is leaving, while the second is the port that the signal is being injected into. S12, therefore, is the signal leaving port 1 relative to the signal being injected into port 2. The four S-parameters associated with an exemplary two-port device are:

S11 is referred to as the "forward reflection" coefficient, which is the signal leaving port 1 relative to the signal being injected into port 1;

S21 is referred to as the "forward transmission" coefficient, which is the signal leaving port 2 relative to the signal being injected into port 1;

S22 is referred to as the "reverse reflection" coefficient, which is the signal leaving port 2 relative to the signal being injected into port 2; and S12 is referred to as the "reverse transmission" coefficient, which is the signal leaving port 1 relative to the signal being injected into port 2.

A large number of commercial test systems are available for S-parameter measurement. Such systems are generally referred to as network analyzers. These instruments typically fall into two classes: scalar and vector. Scalar analyzers determine the amplitudes of the S-parameters only, whereas vector analyzers (VNAs) determine both the amplitudes and the phases. Scalar analyzers are far less flexible and far less accurate than vector analyzers, and are typically only employed in low-grade applications where equipment cost is a driving factor. Although embodiments of the present invention are generally applicable to VNA test instruments, the embodiments may also apply to other types of instruments that characterize S-parameters (or other equivalent measurements) for a multi-port DUT.

Commercial VNA systems typically include a signal generator and a combination of splitters and directional couplers that connect the measurement ports of the VNA to its amplitude and phase detection circuitry (samplers). A typical DUT to be characterized by such a VNA has one, two or more ports, typically with coaxial or waveguide interfaces. For an N-port DUT, the S matrix (N×N) can be defined by: b=Sa, where a is an N-component vector containing the amplitudes of the waves incident on the device ports, and b is a vector containing the amplitudes of the outgoing waves. More formally, the wave amplitudes are defined by: $a_i=(V_i+Z_iI_i)/2$; and $b_i=(V_i-Z_iI_i)/2$, where $a_i$ is the incident voltage wave amplitude, $b_i$ is the outgoing voltage wave amplitude, $V_i$ is the voltage, $I_i$ is the input current, and $Z_i$ is the normalizing impedance, all for the $i^{th}$ port under test.

The port-normalizing impedances ($Z_i$) are typically chosen to be equal to the characteristic impedances of the coaxial cables in the test system, which are 50 Ω in most cases. If a given port is terminated with its normalizing impedance (a matched load) then the incident wave amplitude at that port is identically zero (from $a_i=(V_i+Z_iI_i)/2$).

When a DUT is connected to the test ports of a network analyzer, a signal is applied to each device port in succession, and the reflected and transmitted waves are detected with the aid of the directional couplers. The S-parameters for the DUT are then deduced by measuring the amplitude and phase of each of these waves relative to those of the input signal.

In practice, there are inevitable hardware imperfections or errors in any VNA test system, which are principally related to port mismatch, coupler directivity, and instrument frequency response. Without correction, these imperfections can produce significant measurement errors. Such imperfections are typically compensated for though appropriate VNA calibrations. VNA calibrations are typically performed by connecting physical standards (also known as mechanical primary standards) to each of the ports of the VNA for the purpose of calibration. Electrical characteristics of the standards are derived from known physical properties of the standards, such as physical dimension, conductor material, and the like. The errors of the VNA are typically determined by computing the difference between the VNA measured response of the standards and known electrical characteristics of the standards. After the VNA is calibrated, an uncharacterized DUT can be connected to the VNA for measurement, and the errors associated with the VNA (determined during calibration) can then be mathematically removed from the measurement of the DUT. Many modern VNAs include internal automatic calibrators that perform the calibration.

When the number of port of a DUT (N ports) is greater than the number of ports of the VNA (M ports), N-port calibrations are typically performed using multiport test sets, with multiple M-port calibrations overlaid. The other N-M port contributions are either ignored or their effects are included in complicated ways. For example, their effects may be included through an impedance renormalization process that requires knowledge of all off-state impedances (which are usually obtained with separate calibrations) and typically requires many calibrations at the user plane.

Techniques are needed to reduces the number of calibration steps required (and potential for mistakes) without sacrificing much accuracy.

SUMMARY OF PRESENT INVENTION

Embodiments of the present invention provide efficient yet accurate techniques for performing full N-port VNA calibrations.

In accordance with embodiments of the present invention, port impedances are incorporated as part of a calibration sequence.

In accordance with embodiments of the present invention, sequential characterization and de-embedding are used to generate virtual calibrations required for a renormalization process.

Further embodiments, and the features, aspects, and advantages of the present invention will become more apparent from the disclosure set forth below.

DETAILED DESCRIPTION

Figure 1:
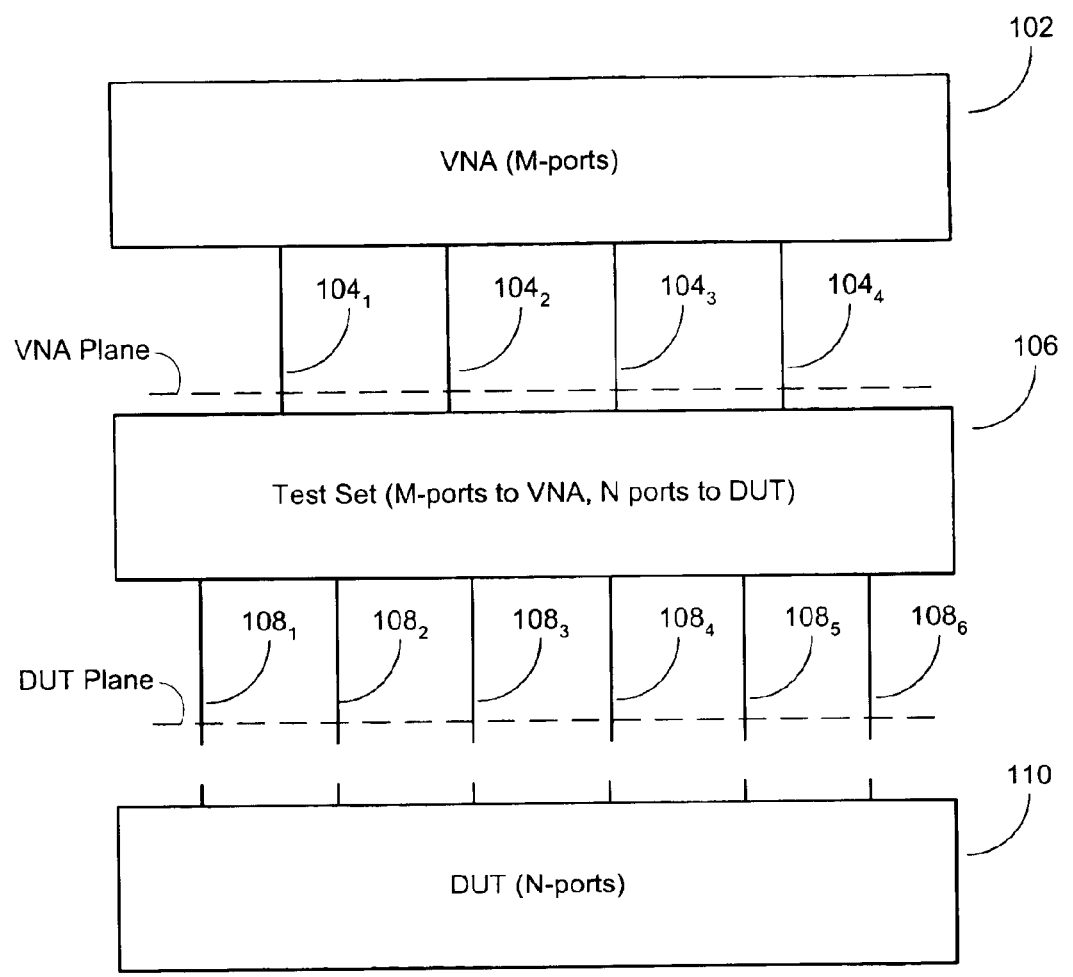
FIG. 1 is a block diagram of an exemplary environment in which embodiments of the present invention can be useful.

As multiport devices become more prevalent and multiport vector network analyzer (VNA) test sets are developed to measure these devices, the issues of proper calibration become more complex. While in principle, full couplers could be placed at each port and both drive and test signals multiplexed, the costs can quickly become prohibitive as N (where N equals the number of ports of a DUT) exceeds 4, and especially if N exceeds 6. Thus, assuming couplers are resident in a base VNA and only one level of multiplexing is done, two issues come to the forefront: (1) is raw directivity sufficient; and (2) how is port match handled since now each port has three impedances associated with it (source, load and off).

The first issue can be handled by proper switch design, although problems may arise above 40 GHz. Embodiments of the present invention do not address the first issue. The second issue is more subtle and revolves around the structure of the whole calibration algorithm. Embodiments of the present invention relate to the second issue. More specifically, embodiments of the present invention provide for efficient and accurate N-port calibrations that properly handle port match, when N>M. Specific embodiments related to acquiring port impedances efficiently. Other embodiments relate to accurate and efficient calibrations processes through a test set.

Assume a base VNA includes M ports, and a device under test (DUT) plane includes N ports, where N>M>1. The simplest possible technique is to consider each S-parameter measurement as just a 2 port measurement. If Sij is to be measured, a 2 port calibration invoking i and j would be deployed, thus correcting for port matches at i and j, but not at the other N-2 ports. If the DUT has little transmission between i and j and these other ports, then this method may be acceptable. However, if the DUT has significant transmission between i and j and the other ports, then substantial errors can result.

Assuming M>2, then another technique is to employ a full M-port calibration. This can improve the results, particularly if the M to N multiplex is chosen so as to cover all of the highly connected paths within the DUT in a single M-port measurement cycle. Here "highly connected" means those ports with substantial transmission between them relative to other port combinations and relative to the base return loss of those ports. To be most effective, this algorithm can be quite complex and may either require knowledge of the DUT or the use of partially calibrated DUT measurements to gain such knowledge prior to the full analysis. In any event, there can be issues as N gets larger than 8 or so. Additionally, if the DUT is highly connected, accuracy will still be impaired.

A further technique, which uses impedance renormalization, is discussed in the following articles, each of which is incorporated herein by reference: J. Tippet and R. Speciale, "A Rigorous Technique for Measuring the Scattering Matrix of a Multiport Device with a 2-port Network Analyzer," IEEE Trans. On MTT, vol. MTT-30, May 1982, pp. 661–666 (referred to hereafter as Tippet); and D. F. Williams and D. K. Walker, "In-Line Multiport Calibrations," $51^{st}$ ARFTG Digest, June 1998, pp. 88–90 (referred to hereafter as Williams). This technique uses multiple M port measurements to fully 'cover' the problem much like using a number of small objects to cover a larger area, with some overlap occurring. Consider a given M port measurement where, without loss of generality, ports 1–M are used and M+1 to N are not. This measurement is normalized to 50 ohms on each of the M ports. The unused ports, in this case, are at the off-state impedances $Z_{M+1}, \ldots, Z_N$. A similar situation occurs for each of the other M port combinations. Since the S-parameters measured this way are referenced to different impedance realms, they cannot be easily combined. If all the sets were to be transformed to a common realm, however, the various measurements could be integrated into a single N×N system. The logical common realm is off state impedances $Z_1, Z_2, \ldots, Z_N$, since all ports will enter their off-state at some point during the measurement.

The classical problem discussed in literature covers M=2, although allusions are made to higher numbers of ports. The general algorithm presented in such literature is as follows:

a. Perform an M port calibration at the DUT plane. The number and type of calibrations (some could be less than M ports) will vary but should present at least a minimum covering set with regard to the $N^2$ available S-parameters. That is, via calibrated measurements, one should be able to measure all $N^2$ parameters.
  i. Example: N=3, M=2: exemplary calibrations 1-2, 1-3 and 2-3;
  ii. Example: N=4, M=3: exemplary calibrations 1-2-3, 1-2-4, 3-4;
  iii. Example: N=6, M=4: exemplary calibrations 1-2-3-4, 3-4-5-6, 1-2-5-6 (The calibrations listed are not unique, but do represent at least a minimum set. If M=4 and N=7, 5 calibrations are required; If M=4 and N=8, 6 calibrations are required; if M=4 and N=9, 8 calibrations are required).

b. Measure all off-state impedances using at least 2 one-port calibrations or some variety of multiport calibrations. Term these values $Z_1, \ldots, Z_N$. All impedances will be complex and be functions of frequency.

c. With the required M port calibrations, measure the DUT. These initial measurements will be referenced to 50 ohms on each of the M ports (unless some other calibration reference impedance was chosen).

d. Using the arbitrary impedance transform, re-reference these $M^2$ S-parameters to $Z_{k1}, \ldots, Z_{km}$ where k1, ..., km are the M-ports involved in this measurement. Repeat this process for each M-port calibration in the calibrations covering set. The impedance transform is performed using a matrix technique described, for example, in Tippet, which was incorporated by reference above, or in Arbitrary Impedance, Anritsu Application Note 11410-00284, May 2002, which is also incorporated by reference herein.

e. Combine all of these measurement results into an N×N matrix by proper port referencing. This data will now be referenced to $Z_1, \ldots, Z_N$.

f. Using the arbitrary impedance transform, re-reference this data back to 50 ohms on all ports (or whatever the desired calibration reference impedance is).

Off-State Impedances

Tippet suggests performing separate one port calibrations to directly measure the port impedances. Practically, this presents a problem in that user-supplied cables often become part of the port and are dynamic. While these could be de-embedded, de-embedding is a time consuming step. Embodiments of the present invention incorporate port impedances as part of the calibration procedure, as described below.

In general, embodiments of the present invention provide efficient methods for performing a full N-port calibration using an M-port VNA, where N>M. However, before discussing details of the embodiments of present invention, it is useful to describe a typical environment in which embodiments of the present invention are useful. FIG. 1 shows an exemplary environment where M=4 and N=6. More specifically, FIG. 1 shows an 4-port VNA 102 and an 6-port DUT 110, as wells as a test set 106 that can be connected between the VNA 102 and the DUT 110. Connectors 104 (e.g., cables) are used to couple the VNA 102 to the test set 106. Further connectors 108 (e.g., user cables) are used to couple the test set 106 to the DUT 110. Test sets, such as test set 106, include a switch matrix that allows attachment of each of the M VNA ports to the N DUT ports. Such test sets are well known in the art, and thus will not be described in additional detail.

Figure 2:
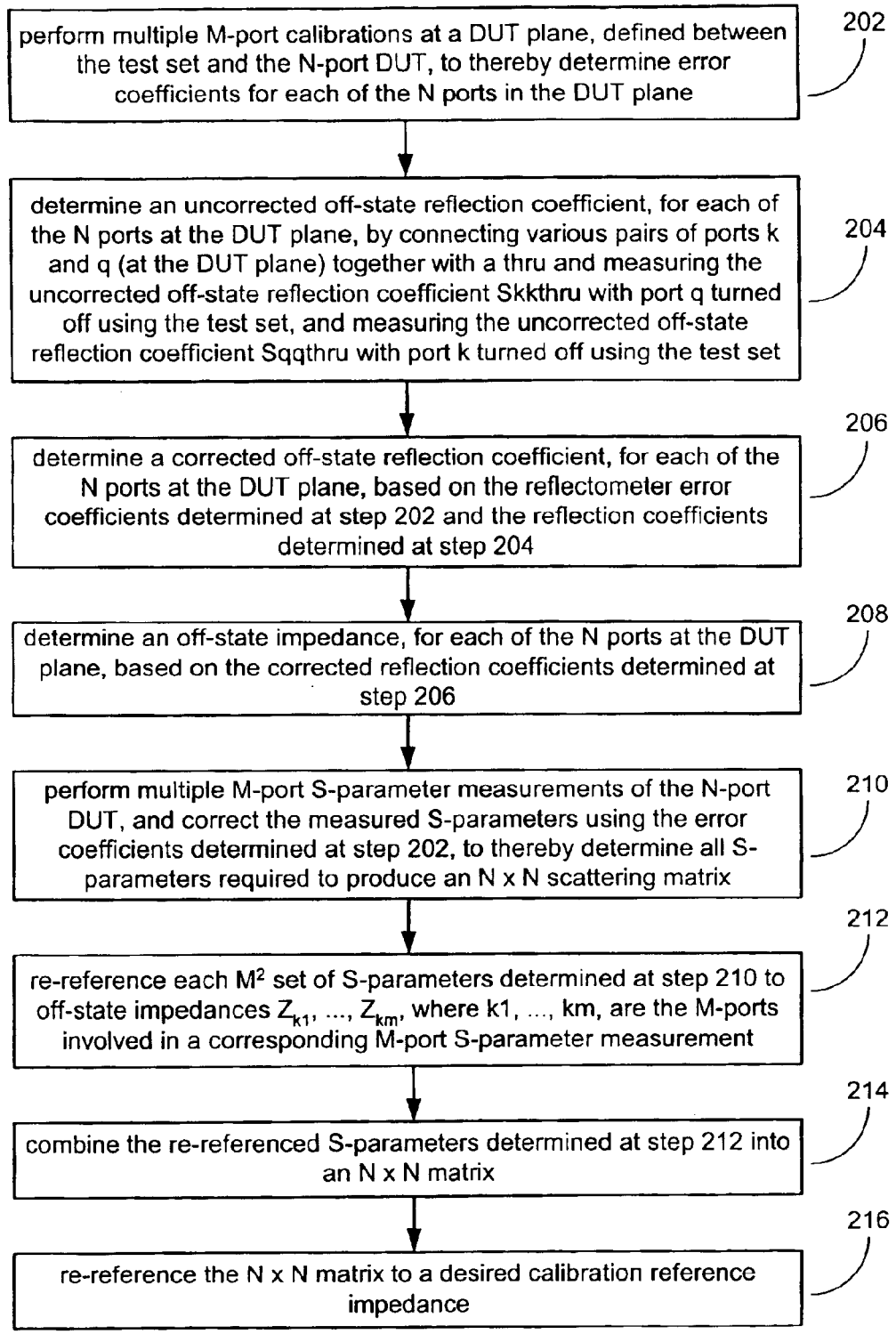
FIG. 2 is a flow diagram useful for describing embodiments of the present invention.

Embodiments of the present invention will now be discussed with reference to the flow diagram of FIG. 2. At a first step 202, multiple M-port calibrations are performed at the DUT plane to thereby determine error coefficients for each of the N ports at the DUT plane. Referring back to FIG. 1, the DUT plane is defined between the test set (e.g., test set 106) and the N-port DUT (e.g., 6-port DUT 110). The error coefficients should preferably include at least the reflectometer error coefficients (i.e., source match (epjS), reflection tracking (etjj) and directivity (edj)), as well as load match error coefficients (epjl) and transmission tracking error coefficients (etij) for the N ports of the DUT plane.

The calibrations of step 202 can be performed using conventional methods, e.g., by attaching standards to the end of the user cables 108. The multiple M-port calibrations should cover all the possible port pairings at the DUT plane. Continuing with the example of FIG. 1, where M=4 and N=6, step 202 can be accomplished, for example, by: performing a 4-port calibration at ports 1, 2, 3, and 4 of the DUT plane (i.e., at the ends of user cables $108_1$, $108_2$, $108_3$ and $108_4$); performing a 4-port calibration at ports 1, 2, 5, and 6 of the DUT plane (i.e., at the ends of user cables $108_1$, $108_2$, $108_5$ and $108_6$); and performing a 4-port calibration at ports 3, 4, 5 and 6 of the DUT plane (i.e., at the ends of user cables $108_3$, $108_4$, $108_5$ and $108_6$). This is just an example. There can of course be other M-port calibrations that will cover all the possible port pairings at the DUT plane. The collection of the multiple M-port calibrations can be thought of as the "calibration covering set." The error coefficients determined at step 202 are stored (e.g., in memory of or associated with the VNA 102) for use in later steps.

It is noted that alternatively, each calibration need not be a full M-port calibration. Rather all or some of the calibrations can use less than M ports, so long as all the possible port pairings at the DUT plane are covered (thereby resulting in error coefficients being determined for each of the N ports at the DUT plane).

By performing the calibration at the DUT plane, these error coefficients will include the effects of any user cables 108, as well as the test set 106, and any cables 104 between the VNA 102 and the test set 106. During the calibration at step 202, a fully connected set of thru lines should be employed (with the exception of RSOL (reciprocal, short, open, load)-like algorithms, in which case load match cannot be directly determined anyway).

At a next step 204, uncorrected off-state reflection coefficients are determined for each of the N ports at the DUT plane. The reflection coefficients are termed "off-state" because there are, by the nature of N being greater than M, always some ports at the DUT plane that are turned-off using the test set (i.e., terminated by the test set, rather than be connected to a port of the VNA). The reflection coefficients are termed "uncorrected" because the error coefficients determined at step 202 have not yet been applied. Step 204 is accomplished by connecting thrus between pairs of ports (each pair or ports being termed ports k and q) and measuring the uncorrected off-stated reflection coefficients, which are termed Skkthru and Sqqthru. More specifically, for each pair of ports k and q (with a thru connected there-between), each uncorrected off-state reflection coefficient Skkthru and Sqqthru should be measured with the other port of the pair turned off(i.e., in the "off-state") using the test set 106. For example, for a pair of ports including ports 1 and 2 at the DUT plane (where port k is port 1, and port q is port 2), S11thru should me measured by connected a thru between ports 1 and 2, with port 2 turned off. Similarly, S22thru can be measured be leaving the thru between ports 1 and 2, but with port 1 turned off.

To complete step 204, each port need only be connected to another port, by a thru, at least once. In fact, N−1 of the ports can all get connected to a common port. For example, where N=6, k can be port 1 for each port pair k and q, requiring simply that a thru be connected between port pairs: 1 and 2; 1 and 3; 1 and 4; 1 and 5; and 1 and 6. This will allow S11thru, S22thru, S33thru, S44thru, S55thru and S66thru to all be measured. For example, when ports 1 and 2 are connected, S11thru is measured with port 1 on (i.e., connected through to VNA) and port 2 turned off (terminated in the test set), and S22thru is measured with port 2 on and port 1 turned off. Of course, other port pair variations are possible and acceptable. Further, it is noted that for the example of FIG. 1, a thru can be connected between a pair of ports at the DUT plane, such at between ports 1 and 2, simply by connecting the ends of user cables $108_1$ and $108_2$ together.

At a next step 206, corrected off-state reflection coefficients are determined using the error coefficients determined at step 202 and the uncorrected off-state reflection coefficients determined at step 204. In other words, the error coefficients determined at step 202 are used to correct the uncorrected off-state reflection coefficients determined at step 204. This will provide a corrected off-state reflection coefficient for each of the N ports at the DUT plane.

In accordance with an embodiment of the present invention, step 206 can be accomplished using the following equation:

$$\Gamma_k = e^{j2\gamma l} \frac{Sqqthru - edq}{etqq + epqS(Sqqthru - edq)}$$

where, $\Gamma_k$ is the corrected off-state reflection coefficient for port k at the DUT plane, $\gamma l$ is a complex phase delay for a thru between ports k and q (which can either be known a priori, or can be determined using well known algorithms), Sqqthru is the measured uncorrected off-state reflection coefficient at port q, when port k is turned off using the test set, edq is the directivity reflectometer error coefficient for port q (determined at step 202), etqq is the reflection tracking reflectometer error coefficient for port q (determine at step 202), and epqS is the source match reflectometer error coefficient for port q (determined at step 202).

There is considerable redundancy, so the above equation need only be solved once for each port. Exemplary techniques for determining the complex phase delay ($\gamma l$) for a thru are disclosed in an article by R. B. Mark and D. F. Williams, entitled "Characteristic impedance measurement using propagation constant measurement," IEEE Micr. and Guided Wave Lett., Vol. 1, June 1991, pp. 141–143, which is incorporated herein by reference.

There is a well know one-to-one correspondence between a port's reflection coefficient and its impedance. Accordingly, once corrected off-state reflection coefficients $\Gamma_{k1} \ldots \Gamma_{km}$ are determined for each of the N ports at the DUT plane, the off-state impedances $Z_{k1} \ldots Z_{km}$ can be easily determined at step 208 using well known techniques.

The DUT 110 is then connected at the DUT plane, and, at a next step 210, the S-parameters of the N-port DUT 110 are determined. This is accomplished by using the VNA 102 to make S-parameter measurements and to correct the measurements using the error coefficients determined at step 202. Most modern VNA's will automatically apply the appropriate error coefficients to correct the S-parameter measurements, although this is not required.

Preferably, the S-parameter measurements are performed using the same multiple M-port groupings (or, all or some groupings can be less than M ports) used at step 202. Continuing with the example above, where N=6 and M=4, multiple 4-port S-parameter measurements can be performed at ports 1, 2, 3, and 4; then at ports 1, 2, 5, and 6; and then at ports 3, 4, 5 and 6. This will result in 48 S-parameter measurements, even though only 36 S-parameter measurements are required for a 6-port DUT (i.e., $N^2$=36 when N=6). This is because redundant S-parameter measurements will be produced.

During each of these M-port measurements, the N–M (i.e., N minus M) unused ports of the DUT (for this example, the 2 unused ports of the DUT) should ideally be terminated by the test set with perfectly matched loads. However, this requirement can not typically be met, especially over wide bandwidths. Accordingly, during the M-port S-parameter measurements, the M ports connected to the VNA will be referenced to a known impedance (likely 50 ohms, but not necessarily), whereas the N–M unused ports are terminated with (and thus referenced to) their corresponding imperfect off-state loads. For example, in the 4-port S-parameter measurement where ports 1, 2, 3 and 4 of the DUT 110 are connected to the VNA 102, ports 5 and 6 of the DUT are terminated with off-state impedances $Z_{k5}$ and $Z_{k6}$; in the 4-port S-parameter measurements where ports 1, 2, 5 and 6 of the DUT 110 are connected to the VNA 102, ports 3 and 4 of the DUT are terminated with off-state impedances $Z_{k3}$ and $Z_{k4}$; and in the 4-port S-parameter measurements where ports 3, 4, 5 and 6 of the DUT 110 are connected to the VNA 102, ports 1 and 2 of the DUT are terminated with off-state impedances $Z_{k1}$ and $Z_{k2}$.

As just explained, portions of each set of S-parameters determined at step 210 are referenced to different impedance realms, and thus not yet combinable. Accordingly, at a next step 212, the sets of S-parameters are transformed to a common realm so that the various S-parameters can be integrated into a single N×N matrix. The realm chosen is $Z_1, Z_2 \ldots Z_N$, since all ports will enter their off-state (i.e., be terminated by an imperfect impedance of the test set) at some point during the S-parameter measurements of step 210. More specifically, in accordance with an embodiment of the present invention, the multiple sets of $M^2$ S-parameters determined at step 210 are re-referenced to off-state impedances $Z_{k1}, \ldots, Z_{km}$ (where k1, ..., km are the M-ports involved in a measurement) using an arbitrary impedance transform, which is described, for example, in Anritsu Application Note 11410–00284, entitled *Arbitrary Impedance* (May 2002), which is incorporated herein by reference.

At a next step 214, the re-referenced S-parameters determined at step 212 are combined into an N×N scattering matrix, by proper port referencing. This data is now referenced to impedances $Z_1, \ldots, Z_N$. As mentioned above, step 210 resulted in redundant S-parameters, and thus, there will be redundant re-reference S-parameters determined at step 212. More specifically, in the example being discussed, there will be two values for S11, S22, S33, S44, S55, S66, S12, S21, S34, S43, S56 and S65. Where redundant values are produced, one of the two values can be selected arbitrarily, or there can be some type of averaging, or the like. The precise method for selecting among or averaging redundant S-parameters, to produce the N×N scattering matrix, is not important to the present invention.

Finally, at a next step 216, the N×N scattering matrix determined at step 214 is re-referenced to a desired calibration reference impedance (e.g., 50 ohms). This can be accomplished, for example, using an arbitrary impedance transform, which has been discussed above.

In the equation discussed above with reference to step 206, there is an assumption that there is a transmission line (of any length or loss) connected between ports k and q, with the transmission line represented by $e^{j2\gamma}$. However, if desired, any other two port device can be used to connected the pair of ports k and q, as long as the devices' S-parameters are known. Thus, the equation discussed above with reference to step 206 can be generalized as follows:

$$\Gamma_k = \frac{(X - S11)}{(S22 * (X - S11) + S12 * S21)},$$

where

S11, S12, S21 and S22 are the S-parameters for the 2-port device connected between ports k and q, and $$X = \frac{Sqqthru - edq}{etqq + epqS(Sqqthru - edq)}.$$

If a transfer calibration tool (e.g., an autocal module or other transfer calibration procedure) is used, then a different algorithm can be used to determine the corrected off-state reflection coefficients. More specifically, if a transfer calibration tool is used, the internal 'thru' structure of the calibration module is employed. In this embodiment, pairs of ports k and q are still connected (with port k turned off, i.e., terminated by test set), but the following equations is used:

$$\Gamma_k = \frac{(mt_{k_q}qq - edq)(ct_{k_q}qq \cdot epqS - 1) + ct_{k_q}qq \cdot etqq}{(mt_{k_q}qq - edq)(\Delta_{kq} \cdot epqS - ct_{k_q}kk) + \Delta_{kq} \cdot etqq}$$

where, $$\Delta_{kq} = ct_{k_q}qq \cdot ct_{k_q}kk - ct_{k_q}\text{kq} \cdot ct_{k_q}qk,$$

the $mt_{k_q}$ terms are the measured S-parameters with the ports connected, and the $ct_{k_q}$ terms are from the standard's characterization file. Note that the $ct_{kk}$ terms are still valid since they describe the standard and do not have to be measured with a port that is turned off.

As mentioned above, in all cases, it may be convenient to keep one of k or q fixed (e.g., as port 1) and then just use all thru lines connected to it to complete the task, but that is not required.

Figure 3:
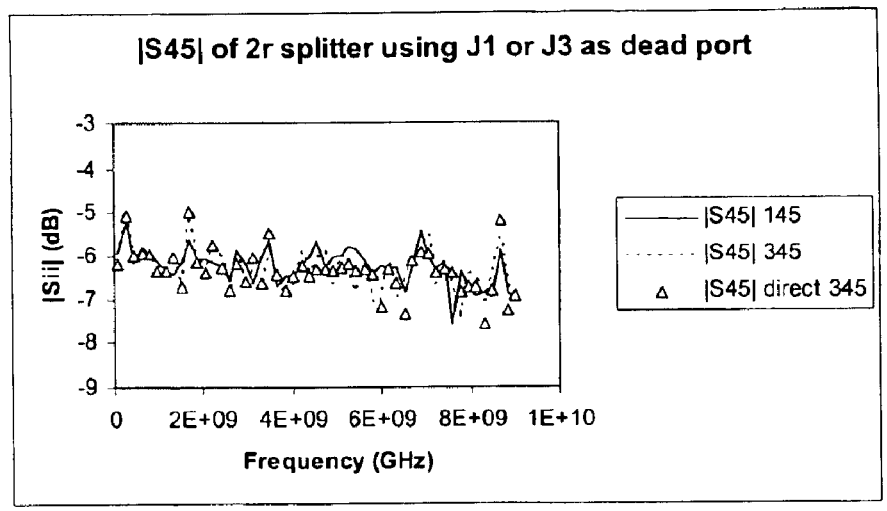
FIG. 3 is a graph of frequency v. dB for scattering parameter $|S_{45}|$.

Measurements have been performed to confirm the accuracy of the above described embodiments of the present invention. In the following example, N=6 and M=4 using the calibration covering set: 1, 2, 3 and 4; 1, 2, 5 and 6; and 3, 4, 5 and 6 (meaning the first M-port calibration used DUT-level ports 1, 2, 3 and 4, and so on). The test DUT was a splitter connected as either 345 or 145. The target parameter was |S45| and was measured separately with a correct 3 port calibration to provide comparison data. As measured with the 6 port calibration with port 3 connected to the splitter, the algorithm has very little work to do (it normalizes and unnormalizes from the same impedances). With port 1 connected, however, the pair of transformations are meaningfully employed. As shown in FIG. 3, all results agree within (cable flex-dominated) uncertainties. Specifically, in FIG. 3, the solid line shows S45 measurements determined using the above described embodiments of the present invention, with the splitter connected as 145. The dashed line shows S45 measurements determined using the above described embodiments of the present invention, with the splitter connected as 345. The triangles in the graph show S45 measurements determined using conventional direct approaches, which are generally not practical, because nearly perfect terminations would need to be manually connected to each of the unused ports in every measurement.

Figure 4:
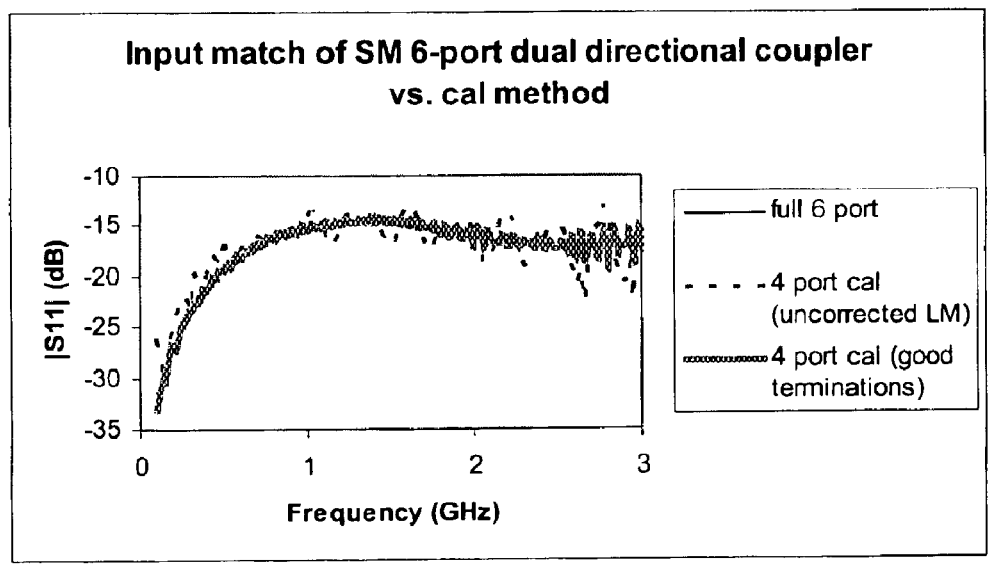
FIG. 4 is a graph of frequency v. dB for scattering parameter $|S_{11}|$.

Referring to FIG. 4, another example consists of the measurement of a dual coupler (6 port in this case) where the match of the input port is of interest. If the single, direct cal (4 port in this case) is used, the load match of the other two ports will not be corrected (i.e., the off-state impedances are ignored) resulting in excess ripple, as shown in the dashed line. The full N-port cal approach is compared to the direct case, where the two unused ports are instead terminated in high quality terminations (which will not be done in typical applications because of the many manual reconnections required), which is shown as a thick solid line. The thin solid line, which essentially overlaps the thick solid line (and, is thus difficult to observe), shows the results using the above described embodiments of the present invention. Since the full 6 port result and the 4 port with good terminations result practically overlay, this indicates that the residual load match of the full 6 port cal is at least 40 dB.

The resulting method is an efficient way to get the required off-state impedance terms without degrading accuracy.

Use of De-embedding to Generate Virtual Covering Calibrations

In the above described embodiments, the calibrations at step 202 were performed at the N-port DUT plane. This is the typical approach, as suggested in Tippet. While possible and accurate, this process can be extremely time consuming as N becomes large (e.g., for N=8, six 4-port calibrations are required), even using automatic calibration techniques. Another approach, according to embodiments of the present invention, is to perform a single M-port calibration at the VNA plane, and then de-embed the test set and any user cables. This process should be done with a sequence of de-embedding steps in order to generate the requisite covering calibrations. The test set (all of the required paths) should be pre-characterized in terms of path S-parameters. If user cables are employed, at least one should be pre-characterized. Methods for measuring the S-parameters for a test set and user cable (i.e., pre-characterizing the test set and user cable) are well known, and thus need not be discussed. Typically, the test set would be pre-characterized at the factory, and the user cable would likely be pre-characterized by a user (but this is not required). The pre-characterized cable will be connected to an arbitrary port, which shall be referred to as the key port.

Figure 5:
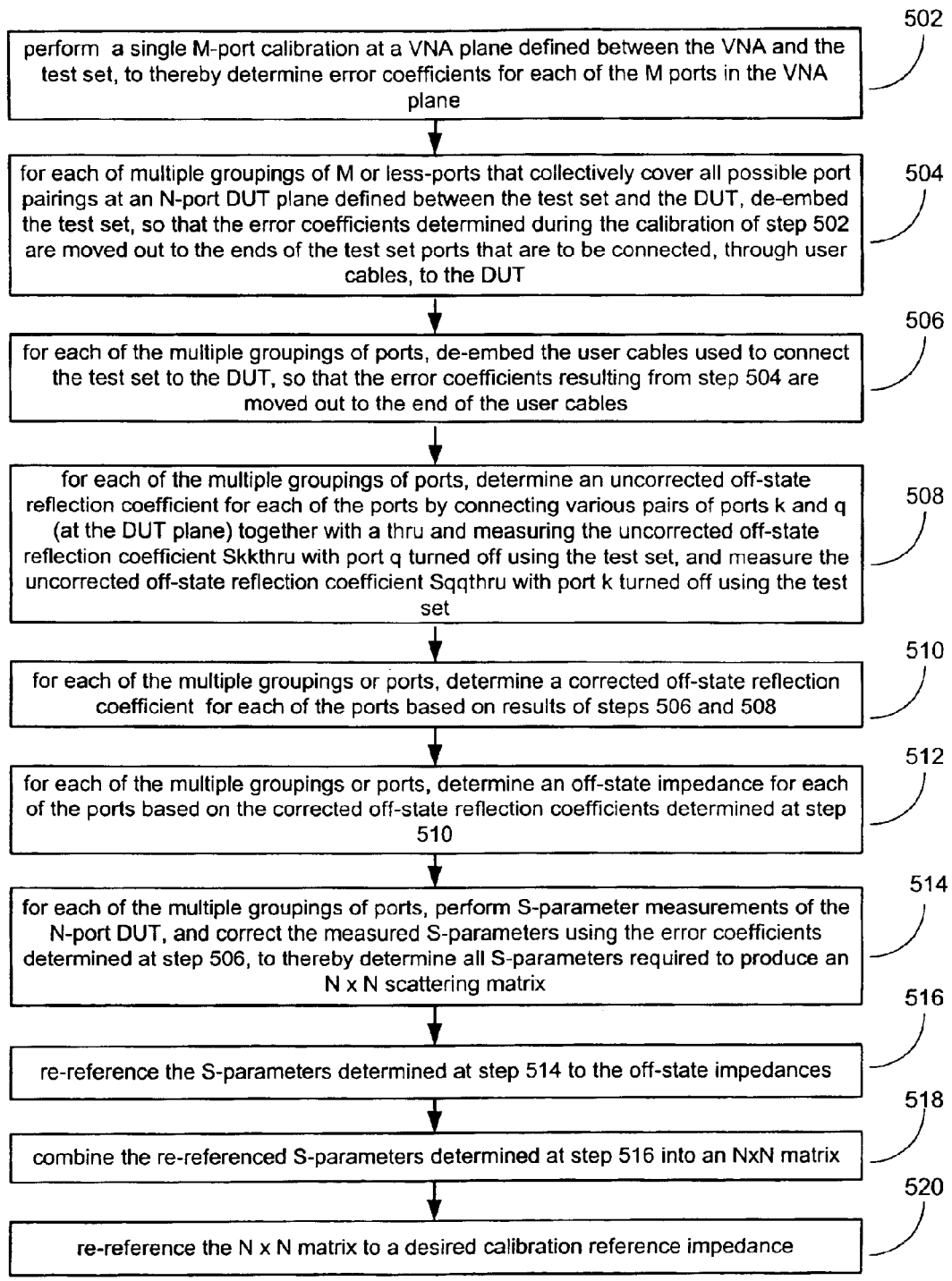
FIG. 5 is a flow diagram useful for describing alternative embodiments of the present invention.

This alternative method for performing the calibration will now be discussed in more detail with reference to the flow diagram of FIG. 5, and the block diagrams of FIGS. 6A–6D.

Figure 6A:
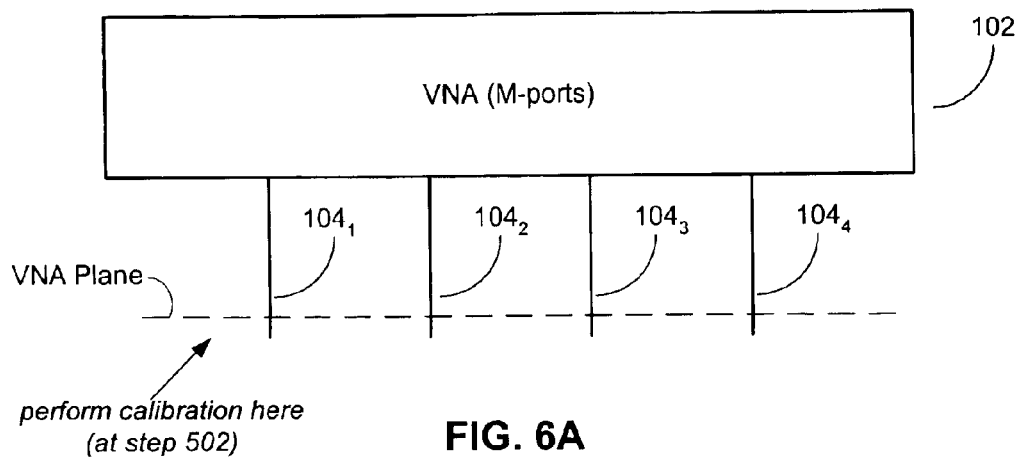
FIGS. 6A–6D are block diagrams useful for understanding the flow diagram of FIG. 5.
Figure 6B:
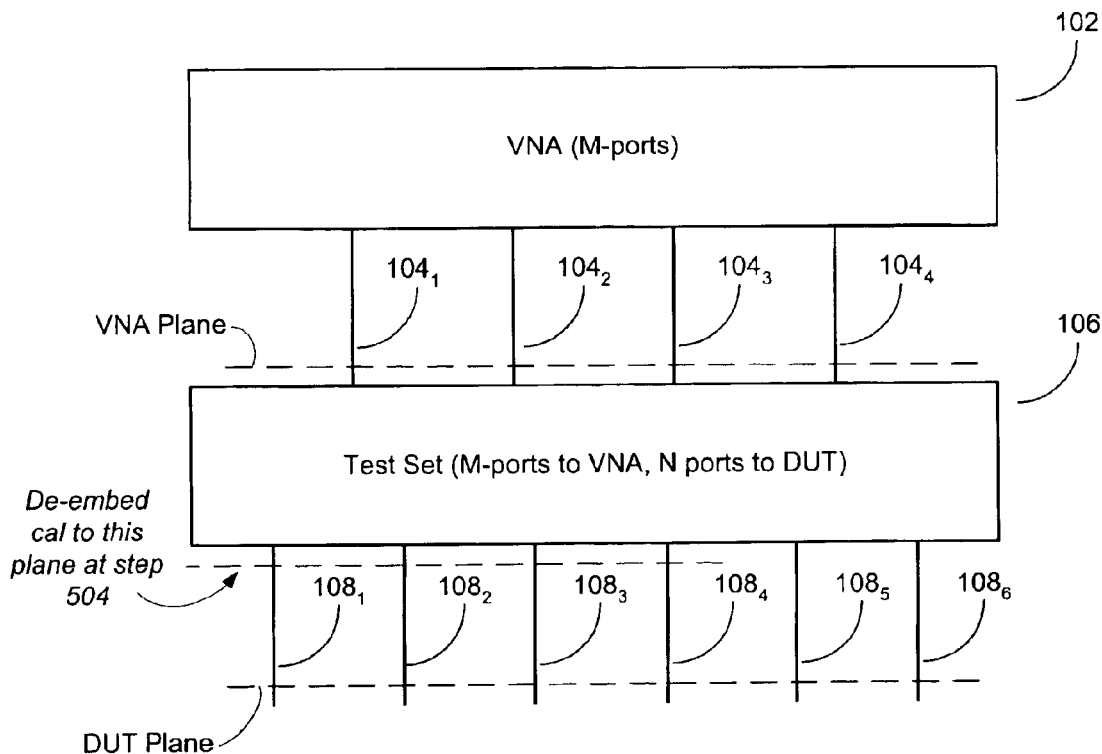
Figure 6C:
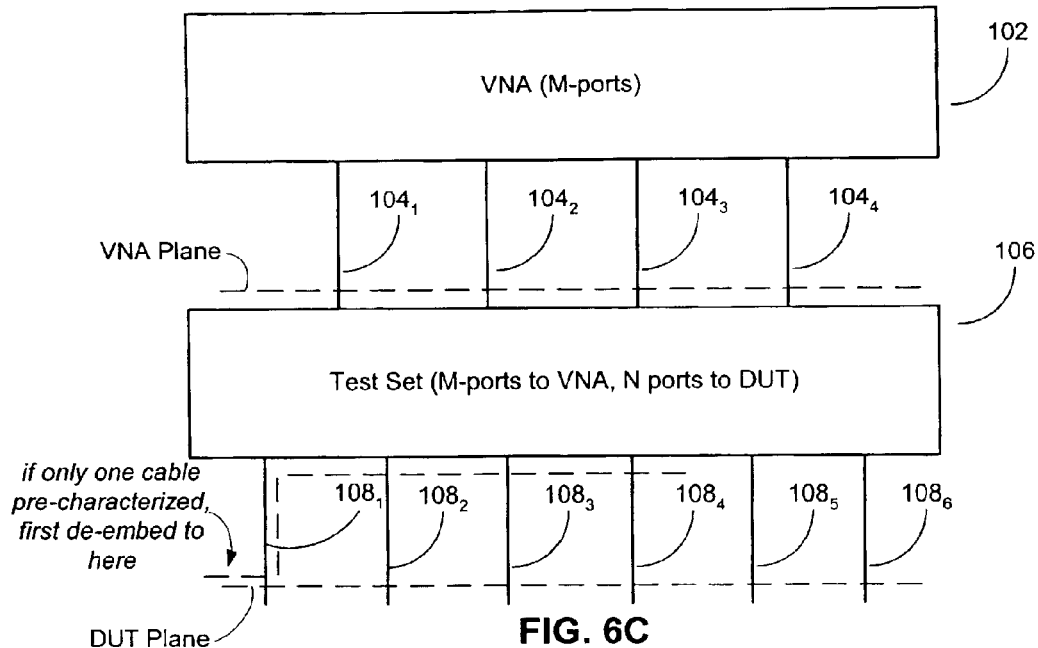

At a first step 502, without the test set connected to the VNA 102, an M-port calibration is performed at the VNA plane, which is defined between the VNA 102 and the test set 106 (and more specifically, where the test set 106 will be connected). Since the VNA includes M ports, only one calibration need be done at this step. This is shown in FIG. 6A. If cables 104 will be used to connect the test set 106 to the VNA 102, then the calibration should be at the ends of the cables 104.

Steps 504–512 are then performed, for each of multiple groupings of M (or less)-ports at the DUT plane, which collectively cover all possible port pairings at the DUT plane. Continuing with the example where M=4 and N=6, exemplary multiple groupings of 4-ports includes ports 1, 2, 3, and 4; ports 1, 2, 5, and 6; and ports 3, 4, 5 and 6. If only one of the user cables 108 is pre-characterized (i.e., the S-parameters are known for that user cable 108), then the first grouping for which steps 504–510 are performed should include the port to which the pre-characterized cable 108 is to be attached. For example, assume the S-parameters for cable 108$_1$ are known, and cable 108$_1$ is attached to port 1, then the first grouping for which steps 504–510 are performed should include port 1 (e.g., be grouping 1, 2, 3 and 4; or grouping 1, 2, 5 and 6).

At a step 504, the M-port calibration (of step 502) is de-embedded to the far end of the test set ports (i.e., the ends of the test set ports that are to be connected directly, or through cables, to the DUT). Assume a grouping includes ports 1, 2, 3 and 4. Then at step 504 the M-port calibration is de-embedded to the far end of the test set ports 1, 2, 3 and 4, as can be appreciated from FIG. 6B. In other words, the M-port calibration at the VNA plane is moved to the physical test set port plane, using the known S-parameters of the test set. This in essence removes the effects of the test set. De-embedding techniques are well known, and thus, need not be described herein.

At a step 506, the calibration just determined at step 504 is de-embedded further to the ends of the user cables. If all the user-cables are pre-characterized, then the cables can be sequentially de-embedded to the DUT plane. However, if only one user cable (e.g., $108_1$) is pre-characterized, then the pre-characterized user cable is first de-embedded, causing the calibration to moved out to the end of the pre-characterized user cable (e.g., cable $108_1$ connected to port 1) as can be appreciated from FIG. 6C. Then the S-parameters for other user cables are determined by connecting the pre-characterized user cable (e.g., user cable $108_1$) to the other cables within this grouping (i.e., each remaining cable is treated as a 2-port DUT, and the S-parameters for them are measured). For example, if the grouping includes ports 1, 2, 3 and 4, and the pre-characterized cable $108_1$ is connected to port 1, then the far end of user cable $108_1$ would be connected one at a time to the far ends of cables $108_2$, $108_3$ and $108_4$, to thereby measure the S-parameters of cables $108_2$, $108_3$ and $108_4$. Phase equal adapters may be used to enable these connections (e.g., if the far ends of a pair of cables are both male or both female). The error coefficients associated with the DUT plane, resulting from the above described de-embedding, are then stored for later use.

Figure 6D:
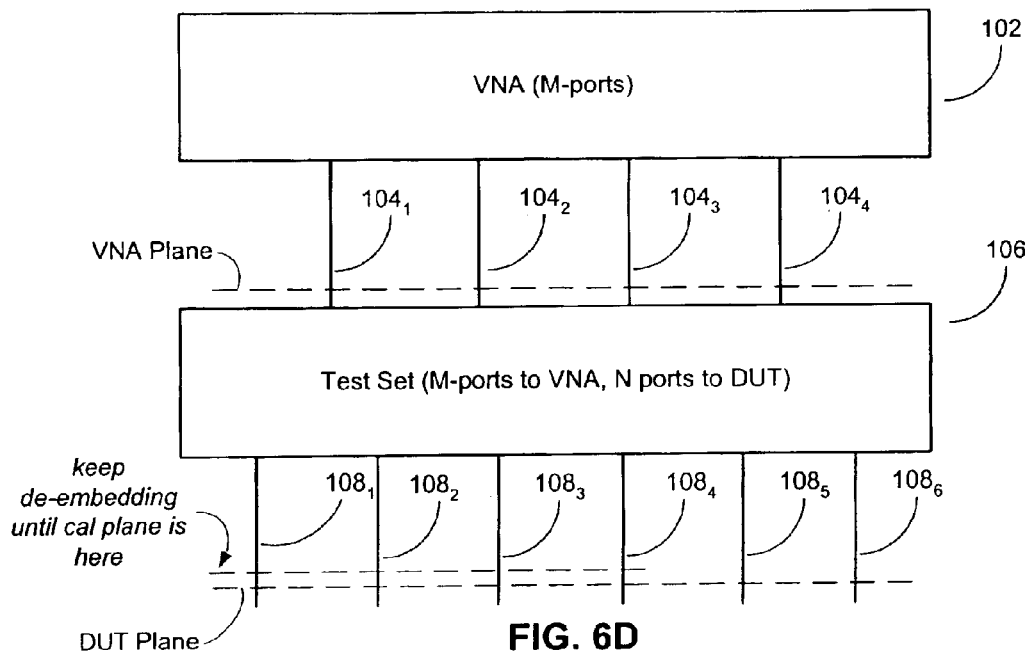

At this point, the error coefficients for some (M or less) of the N ports at the DUT plane have been determined as a result of moving the calibration (for M or less of the N ports) to the DUT plane (as can be appreciated from FIG. 6D). The error coefficients should preferably include at least the reflectometer error coefficients for the N ports of the DUT plane (i.e., source match (epjS), reflection tracking (etjj) and directivity (edj)), as well as load match error coefficients (epjl) and transmission tracking error coefficients (etij).

At a next step 508, an uncorrected off-state reflection coefficient is determined for each of the ports by connecting various pairs of ports k and q (at the DUT plane) together with a thru and measuring the uncorrected off-state reflection coefficient Skkthru with port q turned off using the test set, and measuring the uncorrected off-state reflection coefficient Sqqthru with port k turned off using the test set. Step 508 is similar to step 204 discussed above, and thus will not be explained in additional detail.

At a next step 510, corrected off-state reflection coefficients (Γ) are determined, in a manner similar to that discussed above with respect to step 206. The corrected off-state reflection coefficients are then used at step 512 to determine off-state impedances (Z).

As explained above, steps 504–512 are repeated for each of the groupings of ports. It is also possible that steps 504–512 are performed in parallel for each grouping.

At a next step 514, S-parameter measurements of the N-port DUT are performed for each of the multiple groupings of M (or less) ports, and the measured S-parameters are corrected using the error coefficients determined at step 506, to thereby determine all S-parameters required to produce an N×N scattering matrix. This step is similar to step 210 discussed above.

At a step 516, the S-parameters determined at step 514 are re-referenced to the off-state impedances, in a manner similar to that in step 212 discussed above.

Next, at a step 518, the re-referenced S-parameters determined at step 516 are combined into an N×N matrix, in a manner similar to that in step 214 discussed above.

Finally, at a step 520, the N×N matrix is re-referenced to a desired calibration reference impedance, in a manner similar to that in step 216 discussed above.

Overall, the just described technique of the present invention reduces the number of calibration steps required (and potential for mistakes) without sacrificing much accuracy (limited by drift of test set parameters which are usually not significant). The sequential de-embedding-characterizing-de-embedding allows acquisition of enough information to perform the renormalization process.

Many features of the present invention can be performed in, using, or with the assistance of hardware, software, firmware, or combinations thereof. Consequently, features of the present invention may be implemented using a processing system (e.g., including one or more processors).

Features of the present invention can be implemented in, using, or with the assistance of a computer program product which is a storage medium (media) having instructions stored thereon/in which can be used to program a processing system to perform any of the features presented herein. The storage medium can include, but is not limited to ROMs, RAMs, EPROMs, EEPROMs, DRAMs, VRAMs, flash memory devices, or any type of media or device suitable for storing instructions and/or data.

Stored on any one of the machine readable medium (media), features of the present invention can be incorporated in software and/or firmware for controlling the hardware of a processing system, and for enabling a processing system to interact with other mechanism utilizing the results of the present invention. Such software or firmware may include, but is not limited to, application code, device drivers, operating systems and execution environments/containers.

Features of the invention may also be implemented in hardware using, for example, hardware components such as application specific integrated circuits (ASICs). Implementation of the hardware state machine so as to perform the functions described herein will be apparent to persons skilled in the relevant art(s).

While various embodiments of the present invention have been described above, it should be understood that they have been presented by way of example, and not limitation. It will be apparent to persons skilled in the relevant art that various changes in form and detail can be made therein without departing from the spirit and scope of the invention.

The present invention has been described above with the aid of functional building blocks illustrating the performance of specified functions and relationships thereof. The boundaries of these functional building blocks have often been arbitrarily defined herein for the convenience of the description. Alternate boundaries can be defined so long as the specified functions and relationships thereof are appropriately performed. Any such alternate boundaries are thus within the scope and spirit of the invention.

The breadth and scope of the present invention should not be limited by any of the above-described exemplary embodiments.

What is claimed is:

1. For use in an environment in which a test set is used to connect an N-port DUT to an M-port VNA, where N>M, a method for efficiently performing a full N-port calibration using the M-port VNA, comprising:

a) performing multiple M-port calibrations at a DUT plane, defined between the test set and the N-port DUT, to thereby determine error coefficients for each of the N ports in the DUT plane, said error coefficients including reflectometer error coefficients;

b) determining an uncorrected off-state reflection coefficient, for each of the N ports at the DUT plane, by connecting various pairs of ports k and q (at the DUT plane) together and measuring the uncorrected off-state reflection coefficient Skkthru with port q turned off using the test set, and measuring the uncorrected off-state reflection coefficient Sqqthru with port k turned off using the test set;

c) determining a corrected off-state reflection coefficient ($\Gamma$), for each of the N ports at the DUT plane, based on the reflectometer error coefficients determined at step (a) and the reflection coefficients determined at step (b);

d) determining an off-state impedance (Z) for each of the N ports at the DUT plane, based on the corrected off-state reflection coefficients ($\Gamma$) determined at step (c), e) performing multiple M-port S-parameter measurements of the N-port DUT, and correcting the measured S-parameters using the error coefficients determined at step (a), to thereby determine all S-parameters required to produce an N×N scattering matrix;

f) re-referencing each $M^2$ set of S-parameters determined at step (e) to the off-state impedances $Z_{k1}, \ldots, Z_{km}$ determined at step (d), where k1, ..., km, are the M-ports involved in a corresponding M-port S-parameter measurement;

g) combining the re-referenced S-parameters determined at step (f) into an N×N matrix; and h) re-referencing the N×N matrix to a desired calibration reference impedance.

2. The method of claim 1, wherein the reflectometer error coefficients determined in step (a) include effects of any cables between the VNA and the test set, effects of any user cable between the test set and the DUT, and effects of the test set.

3. The method of claim 1, wherein step (c) includes using the following formula to determine the corrected off-state reflection coefficient for port k:

$$\Gamma_k = e^{j2\gamma l} \frac{Sqqthru - edq}{etqq + epqS(Sqqthru - edq)}$$

where, $\gamma l$ is a complex phase delay for a thru between ports k and q,

Sqqthru is the measured reflection coefficient at port q, when port k is turned off using the test set, edq is the directivity reflectometer error coefficient for port q, determined at step (a), etqq is the reflection tracking reflectometer error coefficient for port q, determine at step (a), and epqS is the source match reflectometer error coefficient for port q, determined at step (a).

4. The method of claim 1, wherein step (c) includes using the following formula to determine the corrected off-state reflection coefficient for port k:

$$\Gamma_k = \frac{(X - S11)}{(S22*(X - S11) + S12*S21)}$$

where

S11, S12, S21 and S22 are the S-parameters for the 2-port device connected between ports k and q, $$X = \frac{Sqqthru - edq}{etqq + epqS(Sqqthru - edq)}$$

Sqqthru is the measured reflection coefficient at port q, when port k is turned off using the test set, edq is the directivity reflectometer error coefficient for port q, determined at step (a), etqq is the reflection tracking reflectometer error coefficient for port q, determine at step (a), and epqS is the source match reflectometer error coefficient for port q, determined at step (a).

5. The method of claim 1, wherein step (e) is performed using an arbitrary impedance transformation.

6. The method of claim 1, wherein step (g) is performed using an arbitrary impedance transformation.

7. The method of claim 1, wherein:

step (a) includes using a transfer calibration tool to perform the multiple M-port calibrations; and step (c) includes using the following formula to determine the corrected off-state reflection coefficient for a port k:

$$\Gamma_k = \frac{(mt_{kq}qq - edq)(ct_{kq}qq \cdot epqS - 1) + ct_{kq}qq \cdot etqq}{(mt_{kq}qq - edq)(\Delta_{kq} \cdot epqS - ct_{kq}kk) + \Delta_{kq} \cdot etqq}$$

where, $\Delta_{kq} = ct_{kq}qq \cdot ct_{kq}kk - ct_{kq}kq \cdot ct_{kq}qk,$ $mt_{kq}$ is a measured S-parameter with ports k and q connected together (at the DUT plane) with a thru, $ct_{kq}$ is a known S-parameter for the transfer calibration tool, edq is the directivity reflectometer error coefficient for port q, determined at step (a), etqq is the reflection tracking reflectometer error coefficient for port q, determine at step (a), and epqS is the source match reflectometer error coefficient for port q, determined at step (a).

8. The method of claim 1, wherein port q is kept the same and port k is changed to produce the various pairs of ports k and q that are connected together at step (b).

9. For use in an environment in which a test set is used to connect an N-port DUT to an M-port VNA, where N>M, a method for efficiently performing a full N-port calibration using the M-port VNA, comprising:

a) performing multiple M or less-port calibrations at a DUT plane, defined between the test set and the N-port DUT, to thereby determine error coefficients for each of the N ports in the DUT plane, said error coefficients including reflectometer error coefficients;

b) determining an uncorrected off-state reflection coefficient, for each of the N ports at the DUT plane, by connecting various pairs of ports k and q (at the DUT plane) together and measuring the uncorrected off-state reflection coefficient Skkthru with port q turned off using the test set, and measuring the uncorrected off-state reflection coefficient Sqqthru with port k turned off using the test set;

c) determining a corrected off-state reflection coefficient ($\Gamma$), for each of the N ports at the DUT plane, based on the reflectometer error coefficients determined at step (a) and the reflection coefficients determined at step (b);

d) determining an off-state impedance (Z) for each of the N ports at the DUT plane, based on the corrected off-state reflection coefficients (Γ) determined at step (c), e) performing multiple M or less-port S-parameter measurements of the N-port DUT, and correcting the measured S-parameters using the error coefficients determined at step (a), to thereby determine all S-parameters required to produce an N×N scattering matrix;

f) re-referencing S-parameters determined at step (e) to the off-state impedances determined at step (d);

g) combining the re-referenced S-parameters determined at step (f) into an N×N matrix; and h) re-referencing the N×N matrix to a desired calibration reference impedance.

10. The method of claim 9, wherein the reflectometer error coefficients determined in step (a) include effects of any cables between the VNA and the test set, effects of any user cable between the test set and the DUT, and effects of the test set.

11. The method of claim 9, wherein step (c) includes using the following formula to determine the corrected off-state reflection coefficient for a port k:

$$\Gamma_k = e^{j2\gamma l} \frac{Sqqthru - edq}{etqq + epqS(Sqqthru - edq)}$$

where,

γl is a complex phase delay for a thru between ports k and q,

Sqqthru is the measured reflection coefficient at port q, when port k is turned off using the test set, edq is the directivity reflectometer error coefficient for port q, determined at step (a), etqq is the reflection tracking reflectometer error coefficient for port q, determine at step (a), epqS is the source match reflectometer error coefficient for port q, determined at step (a).

12. The method of claim 9, wherein step (c) includes using the following formula to determine the corrected off-state reflection coefficient for port k:

$$\Gamma_k = \frac{(X - S11)}{(S22 * (X - S11) + S12 * S21)}$$

where

S11, S12, S21 and S22 are the S-parameters for the 2-port device connected between ports k and q, $$X = \frac{Sqqthru - edq}{etqq + epqS(Sqqthru - edq)}$$

Sqqthru is the measured reflection coefficient at port q, when port k is turned off using the test set, edq is the directivity reflectometer error coefficient for port q, determined at step (a), etqq is the reflection tracking reflectometer error coefficient for port q, determine at step (a), and epqS is the source match reflectometer error coefficient for port q, determined at step (a).

13. The method of claim 9, wherein step (e) and (g) are each performed using arbitrary impedance transformations.

14. The method of claim 9, wherein the multiple M or less-port calibrations performed at step (a) need not all include a same number of ports.

15. The method of claim 9, wherein:

step (a) includes using a transfer calibration tool to perform the multiple M-port calibrations; and step (c) includes using the following formula to determine the corrected off-state reflection coefficient for a port k:

$$\Gamma_k = \frac{(mt_{kq}qq - edq)(ct_{kq}qq \cdot epqS - 1) + ct_{kq}qq \cdot etqq}{(mt_{kq}qq - edq)(\Delta_{kq} \cdot epqS - ct_{kq}kk) + \Delta_{kq} \cdot etqq}$$

where, $$\Delta_{kq} = ct_{kq}qq \cdot ct_{kq}kk - ct_{kq}kq \cdot ct_{kq}qk,$$

$mt_{kq}$ is a measured S-parameter with ports k and q connected together (at the DUT plane) with a thru, $ct_{kq}$ is a known S-parameter for the transfer calibration tool, edq is the directivity reflectometer error coefficient for port q, determined at step (a), etqq is the reflection tracking reflectometer error coefficient for port q, determine at step (a), and epqS is the source match reflectometer error coefficient for port q, determined at step (a).

16. The method of claim 9, wherein port q is kept the same and port k is changed to produce the various pairs of ports k and q that are connected together at step (b).

17. For use in an environment in which a test set is used to connect an N-port DUT to an M-port VNA, where N>M, a method for efficiently performing a full N-port calibration using the M-port VNA, comprising:

a) performing a single M-port calibration at a VNA plane defined between the VNA and the test set, to thereby determine error coefficients for each of the M ports in the VNA plane, the error coefficients including reflectometer error coefficients;

b) performing the following steps for each of multiple groupings of M or less-ports that collectively cover all possible port pairings at an N-port DUT plane defined between the test set and the DUT:

b.1) de-embedding the test set, so that the error coefficients determined during the calibration of step (a) are moved out to the ends of the test set ports that are to be connected, through user cables, to the DUT;

b.2) de-embedding the user cables that are used to connect the test set to the DUT, so that the error coefficients resulting from step (b.1) are moved out to the end of the user cables;

b.3) determining an uncorrected off-state reflection coefficient for each of the ports by connecting various pairs of ports k and q (at the DUT plane) together and measuring the uncorrected off-state reflection coefficient Skkthru with port q turned off using the test set, and measuring the uncorrected off-state reflection coefficient Sqqthru with port k turned off using the test set; and b.4) determining a corrected off-state reflection coefficient (Γ) for each of the ports based on results of steps (b.2) and (b.3); and b.5) determining an off-state impedance (Z) for each of the ports based on the corrected off-state reflection coefficients (Γ) determined at step (b.4);

c) for each of the multiple groupings of M (or less) ports, performing S-parameter measurements of the N-port DUT, and correcting the measured S-parameters using the error coefficients determined at step (b.2), to thereby determine all S-parameters required to produce an N×N scattering matrix;

d) re-referencing the S-parameters determined at step (c) to off-state impedances;

e) combining the re-referenced S-parameters determined at step (d) into an N×N matrix; and f) re-referencing the N×N matrix to a desired calibration reference impedance.

18. The method of claim 17, wherein S-parameters for the test set and at least one of the user cables, used to connect the test set to the DUT, are known.

19. The method of claim 17, wherein a first of the multiple groupings for which steps (b.1) through (b.5) are performed includes a port to which is attached a user cable having known S-parameters.

20. The method of claim 19, wherein step (b.2) includes first de-embedding the user cable having known S-parameters and then measuring the S-parameters of the other user cables by sequentially connecting free ends of the other user cables to a free end of user cable having known S-parameters.

21. The method of claim 20, wherein step (b.2) further includes de-embedding the other user cables using the measured S-parameters of the other user cables.

22. The method of claim 17, wherein the multiple groupings of M or less-ports need not all include a same number of ports.

23. In an environment in which a test set is used to connect an N-port DUT to an M-port VNA, where N>M, a method for efficiently performing a full N-port calibration using the M-port VNA, comprising:

a) performing a single M-port calibration at a VNA plane defined between the VNA and the test set, to thereby determine error coefficients for each of the M ports in the VNA plane, the error coefficients including reflectometer error coefficients;

b) at a N-port DUT plane defined between the test set and the DUT, de-embedding the test set and user cables used to connect the test set to the DUT so that the calibration of step (a) is moved out to the end of the user cables;

c) determining off-state impedances for each of the ports at the DUT plane;

d) performing S-parameter measurements of the N-port DUT, and correcting the measured S-parameters using calibration results of step (b);

e) re-referencing the S-parameters determined at step (d) to off-state impedances;

f) combining the re-referenced S-parameters determined at step (d) into a scattering matrix; and g) re-referencing the scattering matrix to a desired calibration reference impedance.

* * * * *